April 5, 1966 R. E. MILLER 3,244,581

LAMINATE FOR FABRICATING ETCH-PRINTED CIRCUIT

Filed July 26, 1963

Russell E. Miller,
Inventor.
Koenig, Pope, Senniger and Powers,
Attorneys.

United States Patent Office 3,244,581
Patented Apr. 5, 1966

3,244,581
LAMINATE FOR FABRICATING ETCH-PRINTED CIRCUIT

Russell E. Miller, Boston, Mass., assignor to Texas Instruments Incorporated, Dallas, Tex., a corporation of Delaware Filed July 26, 1963, Ser. No. 297,746
1 Claim. (Cl. 161—186)

This invention relates to printed-circuit components and their manufacture, and more specifically, first to etchable conductive multi-ply metal foil, second to a clad laminate formed by an insulating substrate to which the foil is clad, and third to an etch-printed circuit board obtained by etching the foil in its attached condition forming part of the clad laminate.

Among the several objects of the invention may be noted the provision of a multi-ply metal foil adapted for attachment to substrate insulating material to form a clad laminate having improved peel strength; the provision of a clad laminate of the class described which is resistant to atmospheric corrosion; the provision of a clad laminate of this class, the foil facing of which may be accurately etched down to the insulating substrate without material or substantial undercutting, whereby accurate printed-circuit boards may be produced; and the provision of a strong, corrosion-resistant printed-circuit board in which its accurately formed printed circuit and substrate are strongly attached, said circuit having good conductivity and to which electronic circuit components, modules or the like may be accurately attached by welding, brazing or soldering. Other objects and features will be in part apparent and in part pointed out hereinafter.

The invention accordingly comprises the products, materials and combinations of materials, the proportions thereof, steps and sequence of steps, and features of manipulation which will be exemplified in the products and processes hereinafter described, and the scope of the application of which will be indicated in the following claim.

In the accompanying drawings, in which several of various possible embodiments of the invention are illustrated, FIG. 1 is a cross section of a multi-ply metallic foil made according to the invention;

Figure 1:
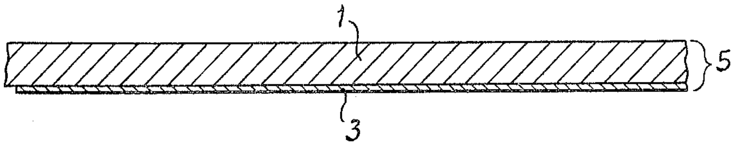

Because the thicknesses of certain layers are extremely small, the drawings do not show these to scale, being primarily diagrammatic.

Corresponding reference characters indicate corresponding parts throughout the several views of the drawings.

Referring now more particularly to FIG. 1 (which shows a fragment of an area of multi-ply metallic foil), numeral 1 indicates an electrically conductive metal layer which may be copper, nickel, iron, steel, Kovar or other iron alloy. Kovar is a trademark for an alloy consisting approximately of 29.0% nickel, 17.0% cobalt, and the remainder iron. At numeral 3 is shown a metal layer which may be aluminum or an intermetallic compound of aluminum preferably with iron, iron alloys or nickel. Layers 1 and 3 are metallurgically bonded. An example of a suitable bonding process is a solid-phase bonding process such as described for example in U.S. Patents 2,691,815 and 2,753,623. During the bonding or through subsequent annealing, the aluminum and the metal of the adjacent layer can be converted to an intermetallic compound, which in the case of aluminum on iron or an iron alloy would for the most part be a compound such as $Fe_2Al_5$. The foil thus produced is numbered 5. The term aluminum as used herein includes aluminum alloys.

Layer 3 is preferably thinner than layer 1, as for example approximately 20% or less of the total thickness of the complete bonded foil 5. A preferred thickness of layer 3 is on the order of 5% or less of said total thickness. The total thickness of the foil 5 may be in the range of about .001 to .007 inch. Thus for a total thickness of foil of .007 inch, the thickness of layer 3 (if 5% of the total thickness) would be .00035 inch. For greater or smaller total thicknesses, the thickness of layer 3 would consequently be more or less. It may in fact be so thin that with sufficient heating much or all of it may become an intermetallic compound of aluminum. Aluminum, as well as an intermetallic compound of aluminum such as $Fe_2Al_5$ is compatible with and has a strong affinity for an epoxy or other thermosetting resinous materials.

Figure 2:
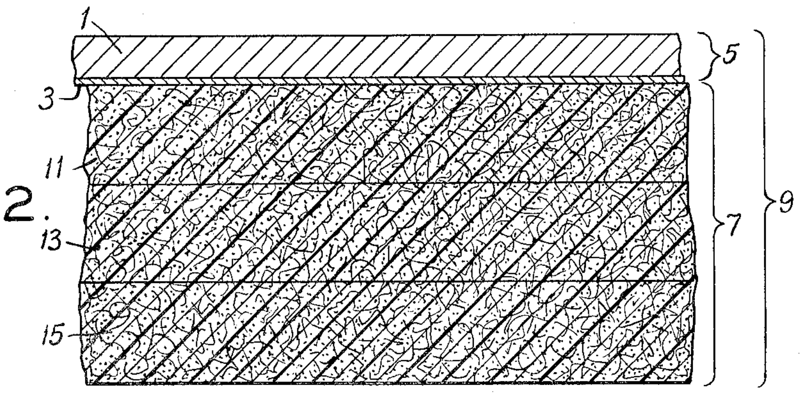
FIG. 2 is a cross section of a clad laminate made according to the invention and employing the foil of FIG. 1.

The foil product shown in FIG. 1 is useful for constructing a clad laminate such as shown in FIG. 2. This as a whole is numbered 9 and comprises an electrically insulating mat board or substrate 7 to which the foil 5 is adhered under heat and pressure. The substrate may, for example, be on the order of .030 inch thick or less, but this is not critical except that it should be thick enough for good dielectric strength and rigidity. The substrate 7 may be made up in a plurality of suitably bonded layers such as designated 11, 13, 15, although this is not necessary in all cases, since it could be made up as a single layer. A suitable material for the substrate 7, whether layered or not, is composed of glass fibres impregnated with a resin such as an epoxy resin. Such a preimpregnated fibre glass substrate material now on the market is known by the trade name Trevarno, F–153. Any resin employed should be of a nature to stick to layer 3 under heat and pressure.

Referring again to FIG. 2, the foil 5, after cleaning as by degreasing and wire brushing on the exposed face of layer 3 if necessary to remove contaminants to bonding, is squeezed against the substrate 7 under heat and pressure. For epoxy-impregnated glass-fibre substrate such as above mentioned, a pressure applied for one to one and one-half hours or so in the range of 70 to 100 p.s.i. and in a temperature range of about 259° F. to 350° F. has been found to be suitable. The particular values depend upon the type of grade of resin impregnated in the fibre glass of substrate 7. Under the heat and pressure the thickness of the substrate 7 is somewhat reduced, as for example from .030 inch to .024 inch. The peel strength of the foil 5 substantially exceeds former peel strengths. An intermetallic compound such as $Fe_2Al_5$ also acts as a heat barrier.

Figures 4, 5:
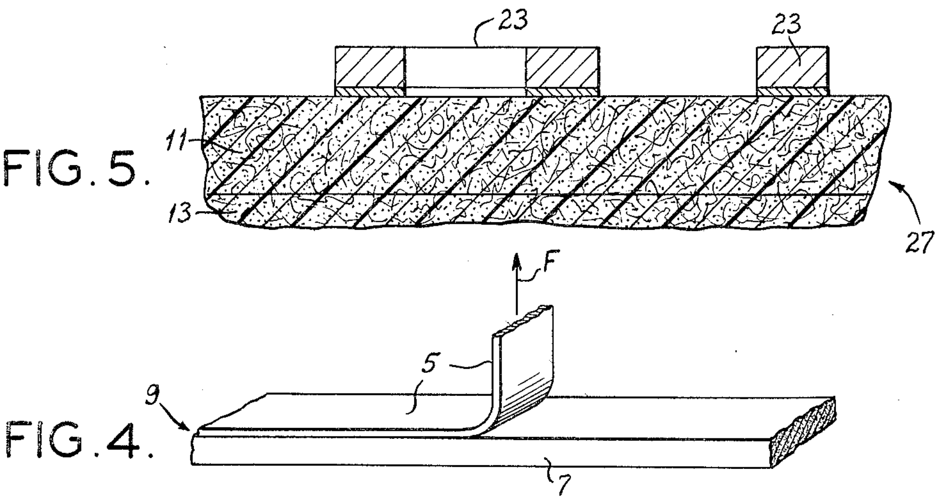
FIG. 4 is a cross section illustrating a typical peel test for determining bond strength between a foil and a substrate of a clad laminate product.
FIG. 5 is a much-enlarged cross section illustrating a small portion of a finished photo-etched circuit board product ready for attachment thereto of circuit modules.

Peel strength is ascertained as illustrated in FIG. 4. A strip of clad laminate 9 of a given width has its foil 5 pulled away at a right angle from its substrate 7. In this FIG. 4, the constituent layers of foil 5 and substrate 7 are not shown. The peel force F required is measured by a conventional spring scale (not shown) in the right-angular line of pull F. Peel strength in pounds per linear inch width of clad laminate can be calculated by dividing the pounds measurement on the scale by the width of the strip. By means of the present invention peel strengths in the range of twelve to fifteen pounds per linear inch can be obtained, as compared with former peel strengths for many other laminates not employing the foil of this invention which former peel strengths are generally limited to the range of five to eight pounds per inch.

As above stated, the layer 1 may be composed of copper or nickel instead of iron, steel or Kovar, but in such cases conversion of the aluminum layer into an intermetallic compound such as $Fe_2Al_5$ will not occur. Nevertheless a bond will be obtained between the aluminum foil and the insulation board superior to those formerly obtained because it has been found that aluminum per se and/or aluminum intermetallic compound have great affinity for the heated resin of substrate 7. Nickel for layer 1 has an advantage in that it has a very high resistance to corrosive atmospheres. Copper, iron and Kovar are, however, easier to etch. Appropriate thicknesses are the same as those above given for layers 1 and 3. Etching is accomplished with the usual applied resist patterns and acid etching fluid appropriate to the metals to be removed by etching. Such fluids may be the usual acids for the purpose or others having the required biting and dissolving effect.

Figure 3:
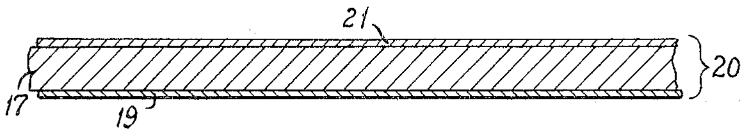
FIG. 3 is a cross section showing another form of foil made according to the invention.

In FIG. 3 is illustrated a form of foil 20 consisting of an iron, steel, copper or Kovar layer 17 bonded on one side with a thin layer of aluminum 19 and on the opposite side with a layer of protective nickel 21. The layer 19 is for bonding with a substrate such as 7 to form a clad laminate as above described. The total thickness of foil 20 may again be on the order of .007 inch or less. The upper limit for the thickness of layer 19 is preferably about 5% or less of this total thickness. The thickness of the nickel layer 21 may vary as desired from a relatively small percentage such as 5% or less to a substantial percentage but preferably short of 95% of the total composite thickness. The nickel layer forms a good protection against corrosive atmospheres.

In all forms of the invention the thinness of the anchoring layer 3 adjacent the insulating board is advantageous in preventing or at least minimizing undercutting by the etching liquid. It has been observed that in many cases certain etching liquids will attack aluminum, an intermetallic compound such as $Fe_2Al_5$, or both, more rapidly than it will a material such as in layer 1 (copper, nickel, iron, steel or Kovar), assuming that the areas attached are equal. But when as here the thin layer of aluminum exposes very little edgewise area to etching attack, little or no undercutting will occur in a thin layer such as 3 or 19. Thus an accurately etched printed-circuit board can be obtained such as fragmentarily illustrated in FIG. 5 and numbered 27 in general. FIG. 5 shows a portion of FIG. 2 as finally etched in the known manner by photo-resist etching or the like. The resulting protruding but strongly attached circuit-forming portions appear at 23. The laminate 9 shown in FIG. 2 is a single clad laminate, i.e., foil 5 is clad only to one side of substrate 7. Though not illustrated in the drawings, it will be understood that in the practice of this invention, substrate 7 may be clad on both sides with foil 5 or foil 20 or with combinations of these.

While the foil 5 has been described as useful for attachment to a substrate incorporating thermosetting epoxy resins such as 7, it will be understood that it may also be employed for attachment to substrates incorporating other thermosetting resins. Moreover, the advantages of the invention are obtainable when the foil 5 is attached to a substrate which includes resin which has an affinity for adherence as above set forth.

In view of the above, it will be seen that the several objects of the invention are achieved and other advantageous results attained.

As many changes could be made in the above products and processes without departing from the scope of the invention, it is intended that all matter contained in the above description or shown in the accompanying drawings shall be interpreted as illustrative and not in a limiting sense.

What is claimed is:

A laminate suitable for the production of an etch-printed circuit board comprising a metal foil having a first layer of steel, a second layer of aluminum solid-phase bonded to one side of the first layer, a third layer of nickel solid-phase bonded to the other side of the first layer, said second layer having a thickness not greater than approximately 5% of the total thickness of the foil, said third layer having a thickness not greater than approximately 5% of said total thickness of the foil, said total thickness of said foil being in the range of approximately .001 inch to .007 inch, and an insulating substrate composed of heat-resistant electrically insulating fibres impregnated with a resin, said substrate being adhesively attached to the second layer of the foil.

References Cited by the Examiner

UNITED STATES PATENTS

| | | | |
|---|---|---|---|
| 2,662,957 | 12/1953 | Eisler | 156—3 XR |
| 2,691,815 | 10/1954 | Boessenkool et al. | |
| 2,731,333 | 1/1956 | Ko et al. | 156—3 |
| 2,777,192 | 1/1957 | Albright et al. | |
| 2,872,391 | 2/1959 | Hauser et al. | |
| 2,876,137 | 3/1959 | Drummond | 29—196.2 |
| 2,876,530 | 3/1959 | Howatt. | |
| 2,970,065 | 1/1961 | Greene | 29—197 XR |
| 3,006,069 | 10/1961 | Rhoads et al. | 29—155.5 XR |
| 3,006,819 | 10/1961 | Wilson et al. | |
| 3,052,015 | 9/1962 | Kerstetter | 29—195 |
| 3,078,563 | 2/1963 | Gould et al. | 29—497.5 |

JACOB H. STEINBERG, *Primary Examiner*.

ALEXANDER WYMAN, *Examiner*.